United States Patent [19] [11] Patent Number: 5,814,531
Anayama et al. [45] Date of Patent: *Sep. 29, 1998

[54] METHOD FOR FORMING SEMICONDUCTOR LASER EMITTING LIGHT FROM SLANT PLANE

[75] Inventors: Chikashi Anayama; Hiroshi Sekiguchi; Makoto Kondo, all of Kawasaki, Japan

[73] Assignee: Fujitsu Limited, Kawasaki, Japan

[*] Notice: The term of this patent shall not extend beyond the expiration date of Pat. No. 5,336,635.

[21] Appl. No.: 593,697

[22] Filed: Jan. 29, 1996

Related U.S. Application Data

[62] Division of Ser. No. 275,427, Jul. 15, 1994, abandoned.

[30] Foreign Application Priority Data

Aug. 30, 1993 [JP] Japan ................................. 5-214479

[51] Int. Cl.⁶ .................................................. H01L 21/00
[52] U.S. Cl. ............................. 438/31; 438/40; 438/41; 438/46; 148/DIG. 95; 257/623
[58] Field of Search ................................ 438/31, 40, 41, 438/46; 148/DIG. 95; 257/623

[56] References Cited

U.S. PATENT DOCUMENTS

| 4,404,678 | 9/1983 | Aiki et al. | 372/45 |
| 4,569,721 | 2/1986 | Hayakawa et al. | 156/649 |
| 4,946,802 | 8/1990 | Shima et al. | 437/129 |
| 5,149,670 | 9/1992 | Isshiki | 437/129 |
| 5,202,285 | 4/1993 | Sugano et al. | 437/129 |
| 5,255,281 | 10/1993 | Sugano et al. | 372/46 |
| 5,336,635 | 8/1994 | Anayama et al. | 437/129 |
| 5,375,136 | 12/1994 | Anayama et al. | 372/46 |

FOREIGN PATENT DOCUMENTS 0 533 197 A3  3/1993  European Pat. Off. .

OTHER PUBLICATIONS

"One–Step–Movpe–Grown Index–Guide GaInP/AlGaInP Visible Laser Using Simultaneous Impurity Doping", Anayama et al, Japanese Journal of Applied Physics, Extended Abstracts of the 1992 Int'l Conference on Solid State Devices and Materials, Aug. 1992, pp. 619–621.
"High–Power Operation of Selfaligned Stepped Substrate ($S^3$) AlGaInP Visible Laser Diode", Furuya et al, Electronics Letters, Jul. 22, 1993, vol. 29, No. 15, pp. 1364–1366.
Patent Abstracts of Japan, vol. 16, No. 579 (E–1299) Dec. 18, 1992 & JP–A–04 225 585.
Patent Abstracts of Japan, vol. 8, No. 84 (E–239) Apr. 18, 1984 & JP–A–59 005 691.
"Alternate Doping of p–type and n–type Impurities for AlGaInP Selfaligned Stepped Substrate ($S^3$) Lasers", Anayama et al, Electronics Letters, Mar. 31, 1994, vol. 30, No. 7, pp. 565–566.

*Primary Examiner*—John Niebling
*Assistant Examiner*—Long Pham
*Attorney, Agent, or Firm*—Nikaido, Marmelstein, Murray & Oram LLP

[57] ABSTRACT

A semiconductor laser includes a patterned semiconductor substrate including a lower flat plane portion, an upper flat plane portion, and a stripe-shaped slant plane portion connecting the lower flat plane portion and the upper flat plane portion, an active layer formed on the semiconductor substrate, an upper cladding layer formed on the active layer, current blocking layers formed on portions of the cladding layer, the portions respectively corresponding to the lower flat plane portion to the upper flat plane portion; and a current channel region formed on a portion of the upper cladding layer corresponding to the slant plane portion. There are satisfied relations $t1>t2$ and $\tan^{-1}(2t1/W) \leq \theta + \phi < 90°$, where $t2$ is thickness of the flat plane portions of the upper cladding layer, $t1$ is thickness of the slant plane portion of the upper cladding layer, $\theta$ is an angle formed between a boundary between the lower flat plane portion and the slant plane portion and a bottom plane of the lower flat plane portion, $\phi$ is an angle formed between a bottom plane of the slant plane portion and extension of the bottom plane of the lower flat plane portion, and W is width of the stripe of the slant plane portion of the active layer.

4 Claims, 9 Drawing Sheets

$\omega = \theta + \phi$
$t1 = BD\sin\omega = BD(\sin\theta\cos\phi + \sin\phi\cos\theta)$
$t2 = BD\sin\theta$
$R = t1/t2$
$= \sin\phi \left(\dfrac{\cos\phi + \cos\theta}{\sin\phi + \sin\theta}\right)$

W=WIDTH OF STRIPE
C,A :CENTER (MID-) POINT
 E :LEG OF PERPENDICULAR FROM C

METHOD FOR FORMING SEMICONDUCTOR LASER EMITTING LIGHT FROM SLANT PLANE

This is a division of application Ser. No. 08/275,427 filed Jul. 15, 1994 now abandoned.

BACKGROUND OF THE INVENTION

1. Field or the Invention

The present invention relates to a semiconductor laser, and in particular, to a semiconductor laser including a pair of portions each having a flat plane and a portion having a slant plane and establishing a connection between the flat plane portions, the slant plane portion emitting light.

2. Description of the Related Art

A visible light semiconductor laser of a 0.6 micrometer ($\mu$) band has recently been regarded as a promising light source capable of improving performance of such optical information processing systems as a point of sales (POS) system, an optical disk device, and a laser printer. An AlGaInP based semiconductor laser using lateral mode control has been expected as one of the visible light semiconductor lasers of the 0.6 micrometer ($\mu$) band.

Such visible light semiconductor lasers are required to have various characteristics such as a short emission wavelength, a low price, a low threshold current, and a high power. High and stable beam characteristics are also desirable, for example, a high kink level of light emission with respect to the current, a far field pattern having a single peak, and low astigmatism.

For the AlGaInP based semiconductor lasers, unlike for the conventional GaAs/AlGaAs based semiconductor lasers, a layer of material including aluminum is required to be grown on a layer made of material including aluminum. However, after the layer of material including aluminum is exposed to air, namely, after the surface thereof is possibly oxidized, it is quite difficult to grow thereon a subsequent layer of material including aluminum. Consequently, it has been difficult to conduct processes in which a layer of material including aluminum is grown and then selectively etched into a mesa shape, and then another layer of material including aluminum is grown thereon to bury the mesa in the layer, thereby obtaining a refractive index distribution having a light confinement effect.

As a semiconductor laser not utilizing such a configuration including a buried mesa, there has been known a semiconductor laser in which a double hetero-structure is grown on a substrate having a step portion between portions of flat planes or surfaces, thereby achieving the lateral mode control.

SUMMARY OF THE INVENTION

It is an object of the present invention to provide a semiconductor laser which is easy to manufacture and has superior characteristic.

In accordance with one aspect of the present invention, there is provided a semiconductor laser including a patterned semiconductor substrate having a lower flat plane portion, an upper flat plane portion, and a stripe-shaped slant plane portion connecting the lower flat plane portion and the upper flat plane portion; an active layer formed on the semiconductor substrate, an upper cladding layer formed on the active layer, current blocking layers formed on portions of the upper cladding layer, the portions being respectively associated with the lower flat plane portion to the upper flat plane portion; and a current channel region formed on a portion of the upper cladding layer, the portion being associated with the slant plane portion. Assuming that the flat plane portion of the upper cladding layer has a thickness t2 and the slant surface portion thereof has a thickness t2. Thickness t1 is larger than t2 (t1>t2). Assuming that a boundary between the lower flat surface portion and flat portion is inclined by an angle of $\theta$ with respect to a bottom plane of the lower flat plane portion, a bottom plane of the slant plane portion is inclined by an angle $\phi$ with respect to an extension of the bottom plane of the lower flat plane portion, and the stripe of the slant plane portion of the active layer has width W, there is held a relation of $\tan^{-1}(2t1/W) \leq \theta+\phi<90°$.

In the active layer, the slant plane portion serves as a light emission region from which light is emitted by recombination. The slant plane portion is supplied with carriers from the current channel region. A sub-portion of the slant plane portion to which carriers are most easily supplied possibly becomes a center of light emission.

When $\theta+\phi$ is less than 90°, the central position of the upper side surface of the current channel region supplying carriers corresponds to the lower-half portion of the slant plane portion of the active layer, and light is therefore emitted from the lower portion of the slant plane portion of the active layer. Consequently, the laser beam characteristic is stabilized. In this way, there is provided a semiconductor laser device having a high current confining or strangulating effect and a stable light beam characteristic.

Other objects and features of the present invention will become apparent from the following detailed description taken in conjunction with the accompanying drawings.

DESCRIPTION OF THE PREFERRED EMBODIMENTS

The present inventors have proposed a semiconductor laser emitting light from slant plane in which light is emitted from a portion having a slant plane (for example, see U.S. patent application Ser. No. 228,453, filed on Apr. 15, 1994 now U.S. Pat. No. 5,436,194, which is a continuation application of U.S. Ser. No. 947,171 filed on Sep. 18, 1992 now abandoned, which is incorporated therein by reference).

Figure 4:
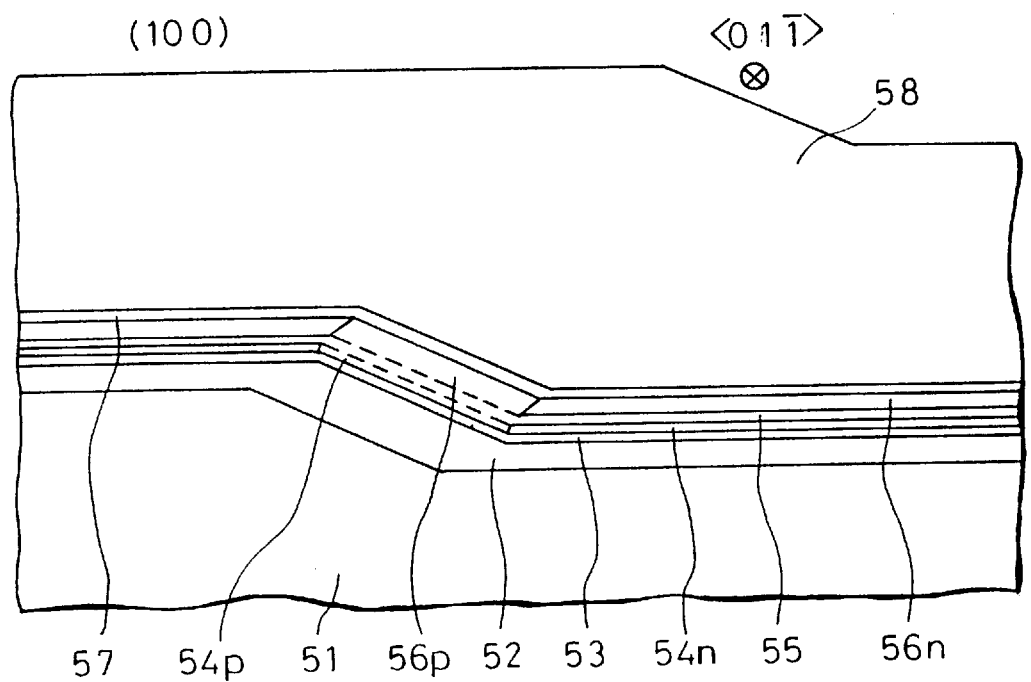
FIG. 4 is a schematic cross-sectional view showing the construction of a semiconductor laser.
Figure 5:
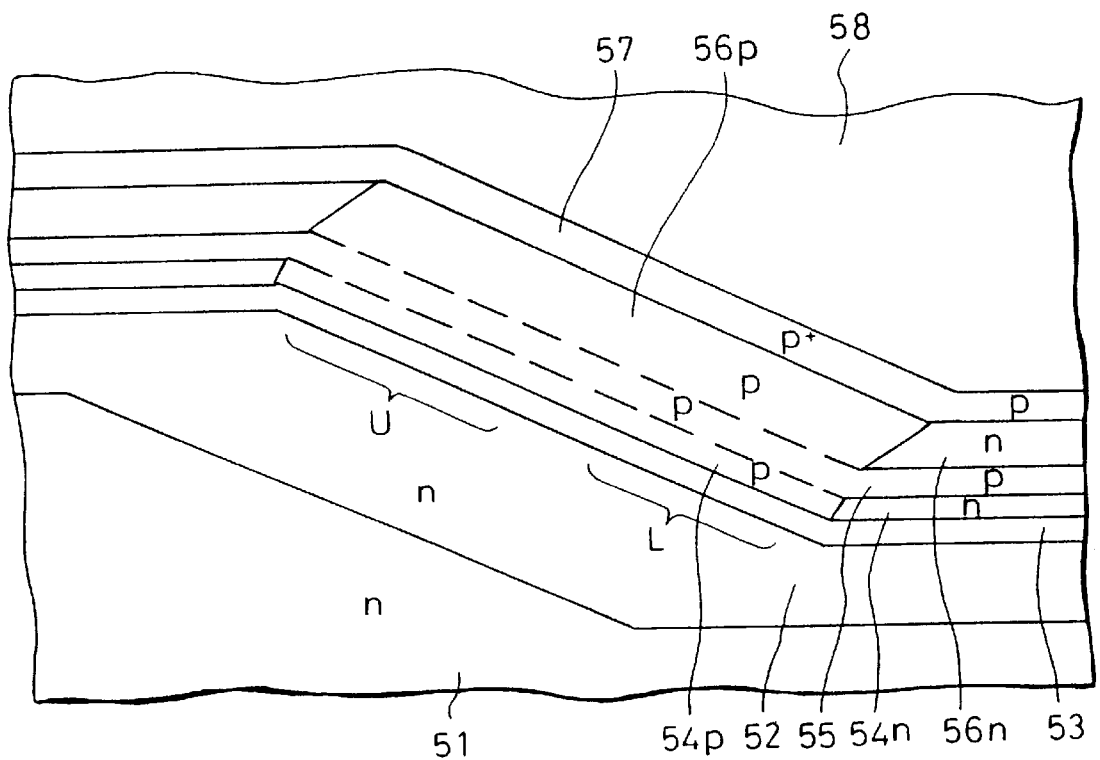
FIG. 5 is a magnified view showing a stacked layer portion of the semiconductor laser of the proposal shown in FIG. 4.

FIG. 4 shows the constitution of the semiconductor laser device, and FIG. 5 is a magnified view of a stacked layer portion of FIG. 4.

In FIGS. 4 and 5, an n-type GaAs substrate 51 has a (100) principal plane including a stripe-shaped (k11) slant plane extending in a <01$\bar{1}$> direction. On the substrate 51 having the slant plane, there are epitaxially formed an n-type AlGaInP lower cladding layer 52 and an undoped (non-doped) GaInP active layer 53 in this order.

On the active layer 53, an AlGaInP layer 54 simultaneously doped with n-type and p-type dopants is grown to form a p-type cladding layer 54p on the slant plane and an n-type remote junction current blocking layer 54n on each of the flat planes.

After growing p-type AlGaInP as an upper cladding layer 55 on the AlGaInP layer 54, there is again grown an AlGaInP layer 56 simultaneously doped with n-type and p-type dopants to form a p-type AlGaInP cladding layer 56p on the slant plane and an n-type AlGaInP current blocking layer 56n on each of the flat planes. On the AlGaInP layer 56, a p-type GaInP spike preventing layer 57 and a p-type GaAs contact layer 58 are grown.

The laminated layers can be grown by consecutively achieving metal organic vapor phase epitaxy (MOVPE) in which the layers are not exposed to air during the production process. This hence enables a layer of material including aluminum to be epitaxially grown on a layer of material including aluminum.

This semiconductor laser device is not configured in the loss guide structure utilizing light absorption. There is adopted a structure using actual refractive index distribution and hence light absorption loss is not required to be taken into consideration. Since the laser device has low astigmatism and the layers can be grown through one continuous growth process by MOVPE, production yield is improved and the price of the laser is efficiently minimized.

Although the semiconductor laser device emitting light from slant plane as shown in FIGS. 4 and 5 has low astigmatism, when the width of the slant plane is set to about 3 μm in consideration of the practical manufacturing technologies, there arises a problem that the entire slant plane does not satisfactorily contribute to light emission.

That is, in a laser device actually produced, light emission takes place in an upper portion or a lower portion of the slant plane as indicated respectively by U or L in FIG. 5. There occurs a phenomenon in which light distribution localized in the upper portion U shifts to the lower portion L and vice versa, leading to an unstable characteristic of the laser beam in the near field.

Description will be given of causes of the unstable characteristic of the emission area in the structure as described above.

Figure 6A:
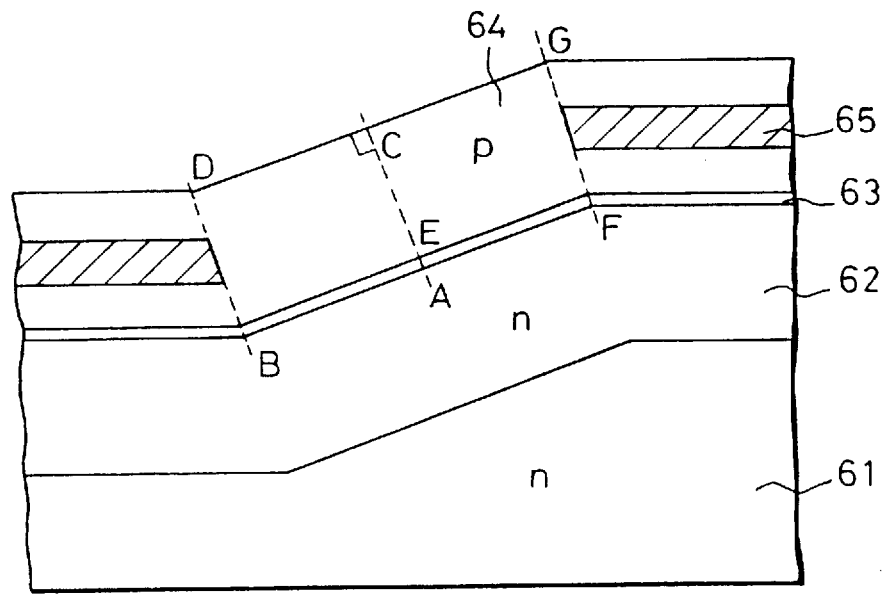
FIGS. 6A and 6B are schematic diagrams for explaining analysis of the preceding proposal by the present inventors.
Figure 6B:
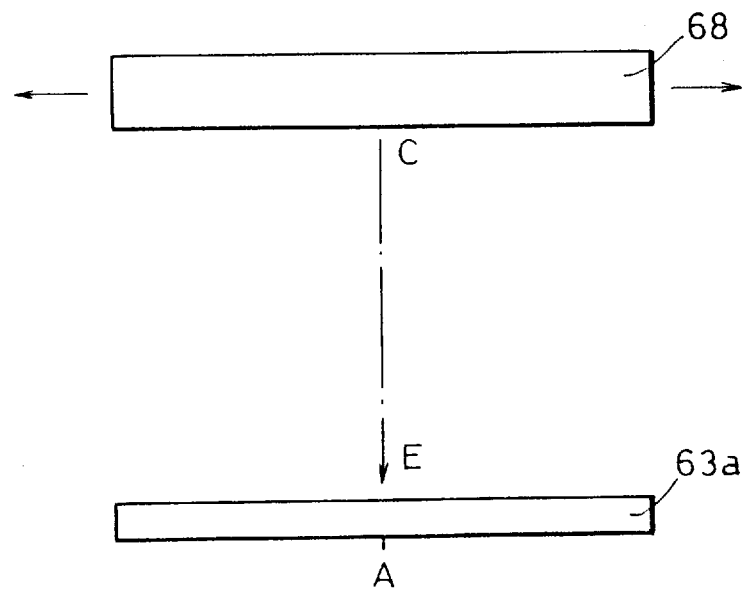

FIGS. 6A and 6B show structure of the laser device simplified for convenience of description.

Assume that an n-type semiconductor substrate 61 includes flat plane portions and a slant plane portion on which an n-type lower cladding layer 62, an active layer 63, and a p-type upper cladding layer 64 are formed as shown in FIG. 6A.

In the p-type upper cladding layer 64, the boundary fronts of the boundaries between the flat plane portions and the slant plane portion move toward the left as the boundaries are formed. In each of the flat plane portions of the cladding layer 64, an n-type current blocking layer 65 is formed at an intermediate position, in the vertical direction, of the cladding layer 64 by the difference in the doping or incorporating probability between p-type and n-type impurities.

In consequence, carriers entering the slant plane portion BF of the active layer 63 from the upper side can be considered to be incident thereto from the slant plane portion DG of the upper plane of the upper cladding layer 64.

If a foot E of a perpendicular drawn from the center or middle point C of the segment DG onto the slant plane portion of the active layer 63 coincides with the center point A of the slant plane portion BF of the active layer 63, probability of light emission in the upper-half portion AF and that of light emission in the lower-half portion in the slant plane portion of the active layer 63 will be almost equal to each other.

FIG. 6B shows in a simplified diagram the state of light emission described above. A carrier supply 68 is provided over a light emitting portion 63a of the active layer 63. When a point E where the perpendicular drawn from the center point C of the carrier source 68 onto the slant plane portion 63a of the active layer 63 intersects the active layer 63 coincides with the center point A of the slant plane portion 63a of the active layer 63, probability of light emission in the left-half portion of the slant plane portion 63a of the active layer 63 is considered to be almost equal to that of light emission in the right-half portion thereof.

When the carrier source 68 moves toward the left or right as indicated by an arrow, the position of the foot E of the perpendicular drawn from the center point C of the carrier source 68 onto the slant plane portion 63a also moves from the center point A of the active layer 63a toward the right or left, respectively.

If the foot E of perpendicular drawn from the center point C of the carrier source 68 is positioned sufficiently far away from the center point A of the slant plane portion 63a of the active layer 63, the current distribution in the slant plane portion 63a will lead to a stable distribution of current in the left-hand or right-hand portions thereof. Assuming that the active layer 63 has a width W, when the point E is displaced from the center point A by at least W/10, there will be obtained a substantially stable light emitting portion.

The present inventors propose stabilization of the laser beam characteristic in which above the active layer, the position of the center point of the carrier supply is positively shifted from the center point of the slant plane portion of the active layer. This idea is based on a fact that the growing speed of such layers can be changed depending on plane orientation of an underlie layer on which the layer of interest is to be grown.

Figure 7A:
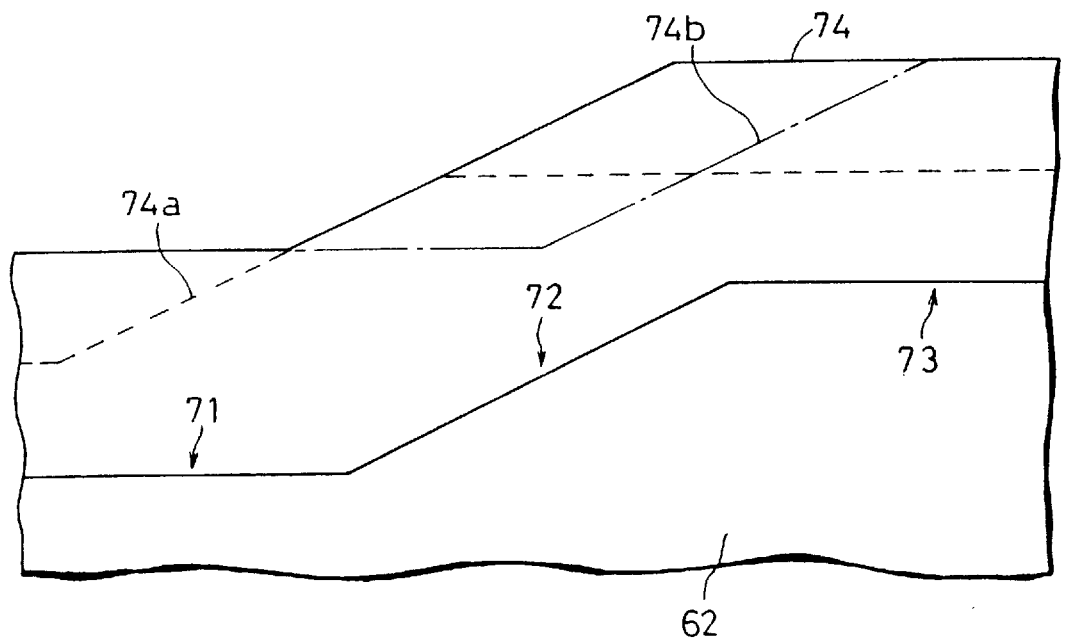
FIGS. 7A, 7B, and 8 are schematic diagram for explaining the concept of the present invention.
Figure 7B:
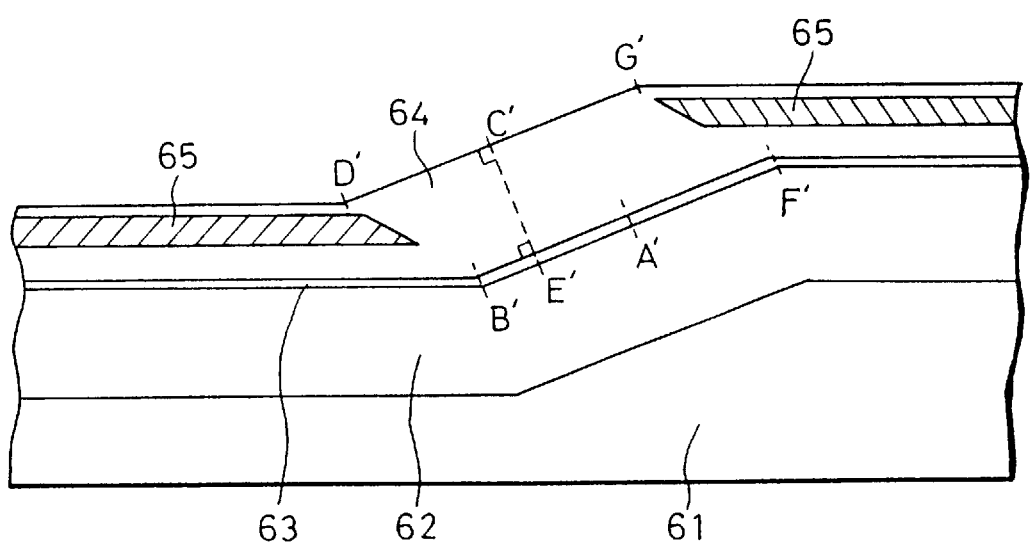

FIGS. 7A and 7B are schematic diagrams for explaining the principle of operation described above.

In FIG. 7A, a semiconductor substrate 62 includes a lower portion having a flat plane 71, a portion having a slant plane 72, and an upper portion having a flat plane 73, the slant plane portion 72 connecting the two flat plane portions 71 and 73 and extending in a direction perpendicular to the sheet of paper of FIGS. 7A and 7B. On the patterned substrate 62 having the slant plane portion 72, layers are epitaxially grown. In the diagrams, a case in which a layer 74 is epitaxially grown on the flat plane portions 71 and 73 and the slant plane portion 72 at the same growing speed is indicated by a solid line.

In epitaxy process, the layer is grown to have a top or growth front surface substantially parallel to a surface of the underlie layer. Consequently, in the upper plane of the grown layer 74, the positions respectively of the flat plane portions and the slant plane portion are slightly shifted relative to the corresponding position of the plane portions of the substrate.

The phenomenon of transition of the emission region between the upper-half and lower-half portions of the active layer in the structure of the preceding proposal presumably implies that the perpendicular drawn from the center point of the carrier source onto the active layer has a foot at a position which is almost the central point of the slant plane portion.

Controlling the conditions of growing the epitaxial layer and positively varying the growth speed between the slant plane portion and the flat plane portions, the contour of the grown layer is remarkably altered.

In FIG. 7A, dotted lines indicate an example of the contour of a growing surface of an epitaxial layer in which the growth speed of the slant plane portion is higher than that of the flat plane portions; whereas, a dot-and-dash line illustratively denotes the contour of the growing surface of the epitaxial layer in which the growing speed of the slant plane portion is lower than that of the flat plane portions.

As can be seen from the diagram, when the growing speed is higher in the slant plane portion than in the flat plane portions, the central point of the slant plane portion of the growing surface moves toward the lower side of the slant plane portion of the underlie surface as indicated by a dotted line 74a, whereas when the growing speed of the slant plane portion is lower than that of the flat plane portions, the central point of the slant plane portion of the growing surface moves toward the higher side of the slant plane portion of the underlie surface.

FIG. 7B schematically shows the configuration of a semiconductor laser device capable of stabilizing a light emission region by using the behavior of the epitaxially grown layer described in conjunction with FIG. 7A.

On a surface of a semiconductor substrate 61 having a stripe-shaped slant plane portion, there are epitaxially and successively formed a lower cladding layer 62, an active layer 63, and an upper cladding layer 64. In an intermediate height of the upper cladding layer 64, current blocking layers 65 having the opposite conductivity type are formed in the flat plane portions.

Considering a region interposed between the current block layers 65 as a region for substantially passing carriers therethrough, a region where carriers flow into the active layer 63 from above is designated B', F', G', and D'.

When the epitaxial growth rate over the slant plane is higher than that over the flat planes, a foot E' of a perpendicular drawn on the active layer 63 from a central point C' of the slant plane segment D'G' on the upper surface of the epitaxial layer is located at a position on the lower side relative to a central point A' of the slant plane segment B'F' of the active layer 63.

Consequently, implementing a structure as shown in FIG. 7B and supplying carriers to the active layer from the upper side, the carriers are transported to be concentrated on the lower side portion of the active layer. The lower side of the slant plane portion of the active layer hence becomes a light emission region to emit light in a stable state.

Figure 8:
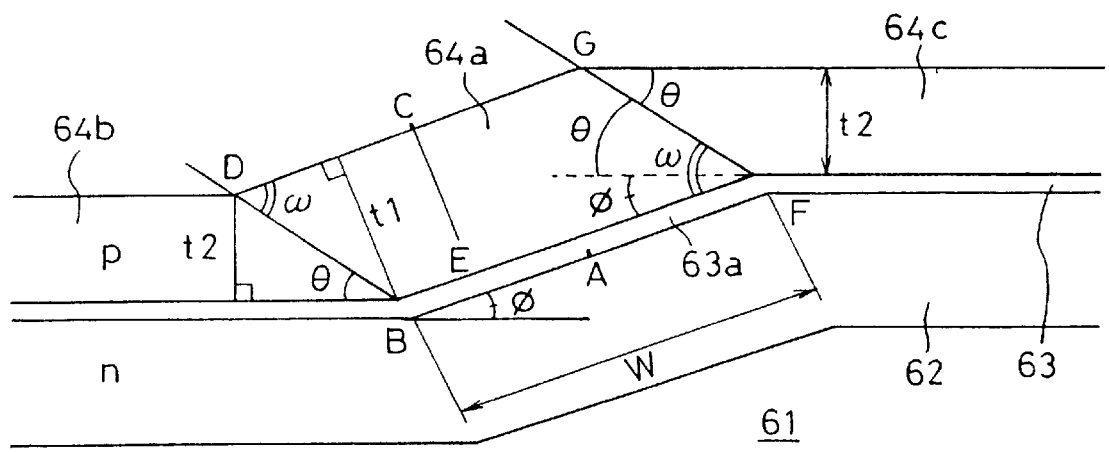

FIG. 8 is a schematic diagram for explaining conditions of stabilizing the light emission position in the slant plane portion by use of the growth rate difference between the slant plane portion and the flat plane portions.

An n-type substrate 61 is beforehand fabricated with a step in a slant plane portion thereof. On the n-type substrate 61, an n-type cladding layer 62, an active layer 63, and a p-type cladding layer 64 are grown in this order.

The active layer 63 includes a slant plane portion 63a having a width W. Assume that the slant plane portion 63a is inclined by angle $\phi$ with respect to the flat plane portion of the active layer 63. The p-type cladding layer 64 has a thickness t2 in the flat plane portions and a thickness t1 in the slant plane portion. The grown layer has growing surfaces parallel to the associated surfaces of the underlie layer.

A slant plane portion 64a of the p-type cladding layer 64 is grown to gradually moves toward the lower flat plane portion.

Denote boundaries between the flat plane portions 64b and 64c and the slant plant portion 64a as BD and FG. A tetragon BFGD forms a parallelogram. The boundary BD between the slant plane portion 64a and the flat plane portion 64b forms an angle $\theta$ relative to a bottom plane of the flat plane portion 64b. There is held a relation of $\angle$ (angle) BFG=$\angle$ BDG=$\omega$=$\theta$+$\phi$. Although the angle $\theta$ is defined on the lower side of the slant plane portion, the boundary FG and the upper plane of the upper flat plane portion 64c logically forms the angle $\theta$ therebetween.

The thicknesses t1 and t2 of the slant plane portion and the flat plane portion of the p-type cladding layer can be represented as $$t1 = BD\sin\omega = BD\sin(\theta + \phi)$$
$$= BD(\sin\theta\cos\phi + \sin\phi\cos\theta)$$
$$t2 = BD\sin\theta$$

The ratio R=t1/t2 between the thicknesses t1 and t2 is obtained as $$R = (\sin\theta\cos\phi + \sin\phi\cos\theta)/\sin\theta$$
$$= \cos\phi + \sin\phi(\cos\theta/\sin\theta)$$
$$= \sin\phi\{(\cos\theta/\sin\theta) + (\cos\phi/\sin\phi)\}.$$

When n-type regions are formed in the flat plane portion of the cladding layer 64, the parallelogram BFGD becomes an area which can pass a current therethrough. In other words, carriers flowing from the upper portion of the drawing to the slant plane portion of the active layer 63 pass the segment DG.

Assume that the center point of the segment DG is C and a perpendicular drawn from the point C onto the slant plane portion of the active layer 63 has a foot E thereon. The points E and A coincide with each other when the parallelogram BFGD is a rectangle, namely, $\omega$=90°.

When the foot E of the perpendicular drawn from the center point C exists between the points A and B, the lower portion BA of the slant plane portion BF of the active layer 63 functions as a light emission region. When the foot E is on the left side of the point 13 in the diagram, although the lower portion 13A of the slant plane portion BF of the active layer 63 emits light in a stable state, the current path becomes longer and hence the resistive component is increased.

When the foot E coincides with the point B, $\tan\omega$=t1/CD=t1/(W/2)=2t1/W.

As described above, in a semiconductor laser device emitting light from slant plane, to obtain the stable light emission from the lower side portion of the slant plane portion, the thickness (growth speed) of the upper cladding layers on the flat plane portions and that of the upper cladding layer on the slant plane portion need only be respectively selected such that $\theta$+$\phi$ is less than 90°, or preferably, $\tan^{-1}(2t1/W) \leq \theta+\phi < 90°$.

When the foot E of the perpendicular drawn from the center point C of the segment DG onto the slant plane portion 63a of the active layer 63 is on the upper side of the center point A of the slant plane portion of the active layer 63, the upper portion of the slant plane portion serves as a stable light emission region. The centerpoint of the current supply region is desirably shifted from the center point of the active layer 63 by at least one tenth of the width of the active layer 63 in a direction parallel to the slant plane.

To satisfy these conditions, the ratio between the thickness (growth rate) of the upper cladding layer on the slant plane portion and that of the upper cladding layer on each flat plane portion is only required to be set to an appropriate value.

Figure 9:
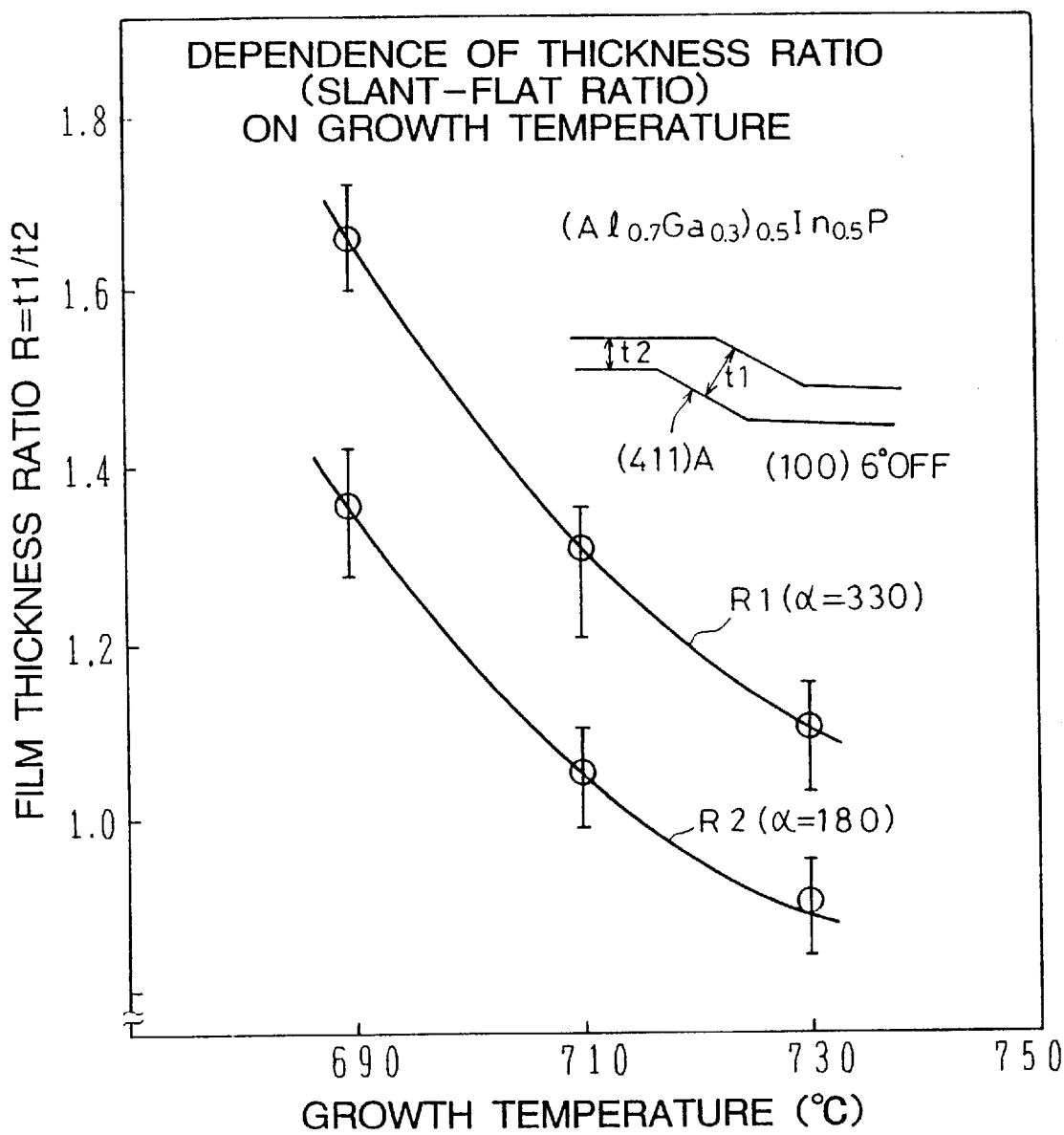
FIG. 9 is a graph showing dependence of film thickness ratio of layers grown over a patterned substrate on growth temperature.

FIG. 9 shows dependence of the film thickness ratio R (slant plane portion vs. flat plane portion) on the growth temperature for $(Al_{0.7}Ga_{0.3})_{0.5}In_{0.5}P$ by way of example. The ordinate stands for the ratio R of thickness t1 of the slant plane portion to thickness t2 of the flat plane portions (R=t1/t2) and the abscissa indicates growth temperature in degrees Celsius (°C.).

Curves R1 and R2 represent dependence of the ratio on temperature where α (V/III ratio) is 330 and 180, respectively. A plane having an off-angle of 6° relative to a (100) plane and a (411)A plane are selected as the flat and slant planes, respectively.

As shown in the graph, the film thickness ratio R lowers as the temperature increases. For α=180, the ratio is equal to or more than when the temperature is equal to or less than about 715°. The ratio is less than one when the temperature is higher than about 715°. For α=330, the ratio R is more then one in a temperature range from 690° C. to 730° C. As the temperature increases in this range, the value of R is decreased from about 1.7 to about 1.1.

The temperature dependence of the film thickness ratio can be approximated as follows:

$$R = aTg^2 + (-)bTg + c + d\alpha,$$

where $a=1.9999\times10^{-4}$, $b=0.297985$, $c=111.505$, and $d=1.6667\times10^{-3}$, and Tg and a stands for the growth temperature and the V/III ratio, respectively.

The V/III ratio is ordinarily defined as a ratio between a flow rate of group V element(s) and group III element(s) supplied in an MOVPE apparatus. The ratio between quantities of group V material and group III material entering the substrate surface plays an important role in controlling the contour of a layer to be grown.

It is therefore favorable to conduct correction of the V/III ratio by the growing apparatus using such parameters as growth pressure $P_G$ (torr), growth efficiency $E_{RG}$ (μm/mol), and total flow rate $F_T$ (sml) as follows:

$$\alpha = 128 \times \alpha_{EXP} \times P_G / (E_{RG} \times F_T),$$

where $\alpha_{EXP}$ denotes a corrected V/III ratio.

Shifting the central position of the slant plane portion on the upper surface of the upper cladding layer from the central position of the slant plane portion on the lower surface thereof, the stable light emission region can be localized on the lower or upper side of the slant plane portion of the active layer. However, in consideration of stability of light emission, it is favorable that the thickness of light emission region of the active layer is larger than that of peripheral (flat plane) regions thereof.

To this end, when thickness of the slant plane portion of the active layer is larger than that of each flat plane portion thereof, the center position of the slant plane portion on the upper surface of the upper cladding layer is, when projected on the active layer, on the lower side of the central position of the slant plane portion of the active layer.

Figure 1:
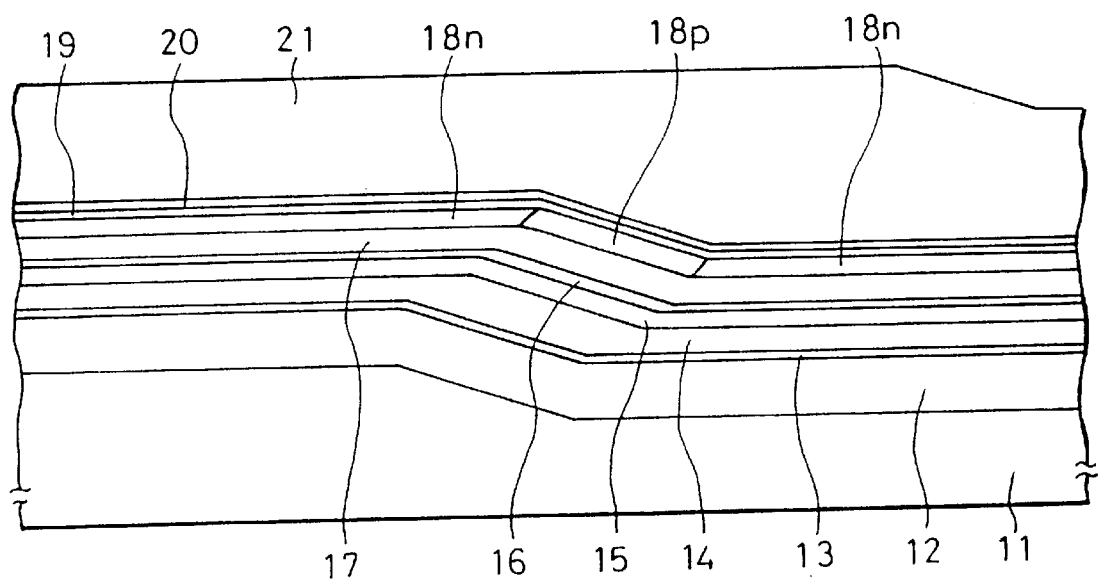
FIG. 1 is a cross-sectional view schematically showing the construction of a semiconductor laser according to an embodiment of the present invention.

FIG. 1 schematically shows a structure of a semiconductor laser according to an embodiment of the present invention. Each stacked layer is grown by MOVPE in which the growth pressure, growth efficiency, and total flow rate are set to 50 torr, about 800 μm/mol, and 8 sml, respectively. Hydrogen is used as the carrier gas, the substrate has a (100) plane with an off-angle of 6° in the direction relative to the (111)A plane. This is also the case with all (100) planes which will be described later.

An AlGaInP layer is adopted as the upper cladding layer. For AlGaInP doped with selenium (Se), when the VI/V ratio is about $2\times10^6$ ($H_2Sg$), there is obtained a carrier concentration of about $8\times10^{17}$ cm$^{-3}$ in (100) plane. In the (411)A plane, carrier concentration is about $2.0\times10^{17}$ cm$^{-3}$. Here, the activation probability is almost one in both the planes. This means that selenium which is an n-type impurity substance is much more doped in the (100) plane than in the (411) plane.

As for zinc which is a p-type dopant, when dimethylzinc (DMZn) is used as the dopant gas and the II/III ratio is 0.1, there are attained carrier concentrations of about $1\times10^{17}$ cm$^{-3}$ and about $7\times10^{17}$ cm$^{-3}$ in the (100) and (411)A planes, respectively. That is, zinc which is a p-type impurity substance is far more doped in the (411)A plane than in the (100) plane.

As for magnesium which is a p-type dopant, when cyclopentadienylfnagnesium (Cp2Mg) is utilized as the dopant material and the II/III ratio is about $5\times10^{-5}$, carrier concentrations in the (100) and (411)A planes are obtained as about $1\times10^{17}$ cm$^{-3}$ and about $4\times10^{17}$ cm$^{-3}$, respectively. Magnesium as p-type dopant is more doped in the (411)A plane than in the (100) plane.

As above, using an impurity or impurities having different incorporation probability depending on orientations of grown surfaces, a suitable current path can be formed. That is, in a growing process, the doping quantity can be altered between a slant plane portion and a flat plane portion and there can be formed regions having opposite conductivity types in the slant and flat planes.

Figure 2:
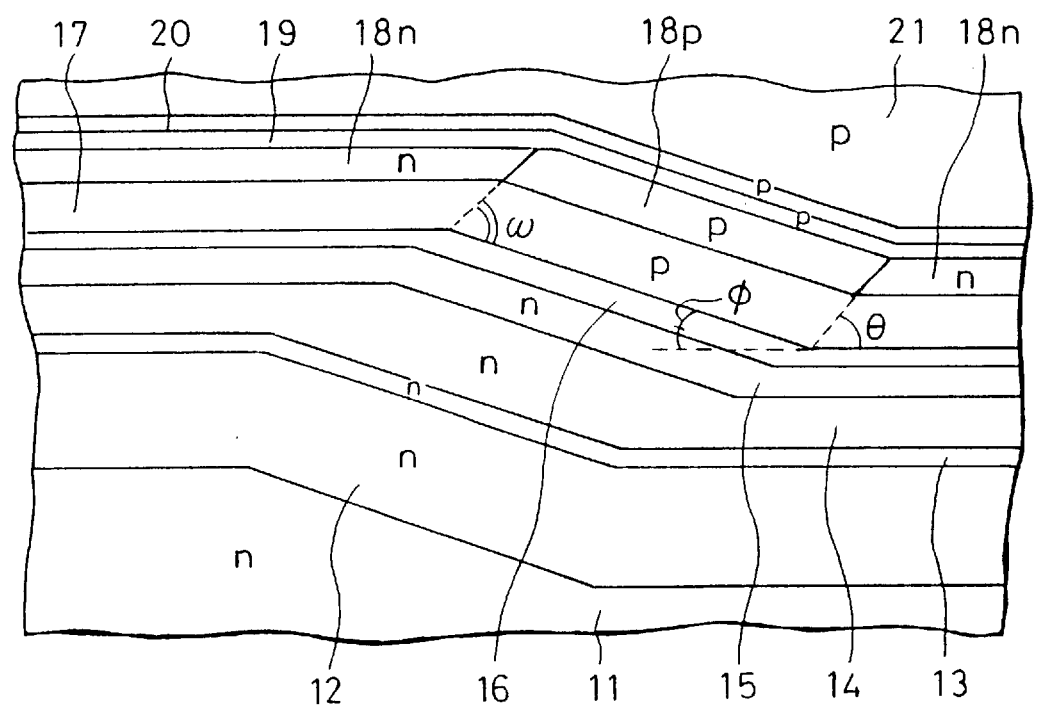
FIG. 2 is a magnified view showing a stacked layer portion of the semiconductor laser shown in FIG. 1.

FIGS. 1 and 2 show a semiconductor laser emitting light from slant plane according to an embodiment of the present invention in which FIG. 2 shows a magnified view of a stack portion of FIG. 1.

In FIGS. 1 and 2, an n-type GaAs substrate 11 doped with silicon includes flat plane portions with (100) planes having an off-angle of 6° toward the (111)A plane and a slant plane portion with a (411)A plane.

On the substrate 11, there are laminated a first n-type GaAs buffer layer doped with selenium 12, a second n-type $Ga_{0.5}In_{0.5}P$ buffer layer doped with selenium 13, a lower cladding layer 14 made of n-type $(Al_{0.4}G_{0.6})_{0.5}In_{0.5}P$ doped with selenium, and a guide layer 15 made of n-type $(Al_{0.4}Ga_{0.6})_{0.5}In_{0.5}P$ doped with selenium, thereby forming n-type regions.

Formed on the guide layer 15 is an active layer 16 of undoped $Ga_{0.5}In_{0.5}P$ having a surface contour similar to that of the substrate and hence including flat plane portions and a slant plane portion.

There are formed on the active layer 16 a first upper cladding layer 17 of p-type $(Al_{0.7}Ga_{0.3})_{0.5}In_{0.5}P$ doped with magnesium, a second upper cladding layer 18 of $(Al_{0.7}Ga_{0.3})_{0.5}P$ doped with zinc and selenium at the same time, including a clad region 18p and current blocking regions 18n.

Zinc is a p-type impurity having a high doping efficiency (incorporation probability) in the slant plane portion and selenium is an n-type impurity having a high doping efficiency (incorporation probability) in the flat plane portions. When zinc and selenium are simultaneously doped, an n-type region and a p-type region can be therefore formed in the flat plane portions and in the slant plane portion, respectively. Consequently, the p-type cladding layer can be formed on the slant plane portion while the current blocking layer is grown on the respective flat plane portions.

On the AlGaInP layer 18 simultaneously doped with zinc and selenium, there are formed a first p-type spike preventing layer 19 of $(Al_{0.4}Ga_{0.6})_{0.5}In_{0.5}P$ doped with magnesium, a second p-type spike preventing layer of zinc doped $Ga_{0.5}In_{0.5}P$, and a p-type contact layer 21 of zinc doped GaAs.

Magnesium and zinc adopted as impurities for these layers are p-type dopants of which the doping efficiency is higher in the slant plane portion than in the flat plane portions. As a result, the region of the slant plane portion has a lower resistance and hence functions as a current path.

In the diagram, angles $\theta$, $\phi$ and $\omega$ designate angles as illustrated in FIG. 8.

In the configuration of FIGS. 1 and 2, the first and second spike preventing layers 19 and 20 are p-type regions, however, resistance thereof is lower in the slant plane portion than in the flat plane portion. These layers 20 and 19 are followed by the AlGaInP layer 18, which has been simultaneously doped with zinc and selenium and which consequently includes n-type regions 18n in the flat plane portions and a p-type region 18p in the slant plane portion.

In consequence, a hole current flowing from the contact layer 21 is concentrated onto the slant portion through the spike preventing layer 20 and 19 and then is strangulated in the p-type region 18p of the AlGaInP layer 18. When each of the flat plane portions on both sides of the slant plane portion has a width above a certain value, it can be considered that substantially an equal amount of holes flow from both flat plane portions into the slant plane portion.

Consequently, adjusting thicknesses of grown films such that the central point of the upper plane of the second upper cladding layer 18p exists on the lower side of the intermediate point of the slant plane portion of the active layer, the lower region of the slant plane portion of the active layer 16 act as a stable current concentrated region.

In other words, the above growth conditions need only be satisfied in the epitaxial growth of the first and second upper cladding layers 17 and 18p. More favorably, the central point of the upper plane of the second upper cladding layer 18p is arranged at a position shifted to the upper or lower side by at least 1/10 of the width of the active layer relative to the central point of the active layer.

Subsequently, a method of manufacturing the semiconductor laser of FIGS. 1 and 2 will be briefly described.

Figure 3A:
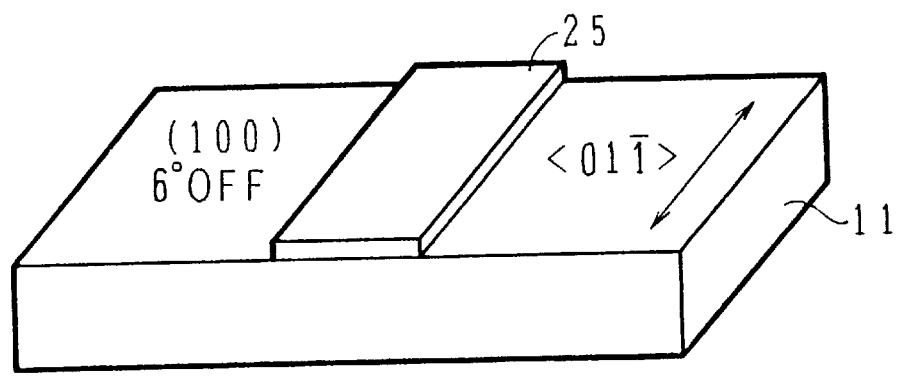
FIGS. 3A and 3B are schematic diagrams showing a process of forming a substrate for the semiconductor laser shown in FIG. 1.

As shown in FIG. 3A, there is first prepared a GaAs substrate 11 with a (100) plane having an off-angle of 6° toward the (111)A plane. The GaAs substrate 11 is doped with silicon to have a carrier concentration of about $4 \times 10^{18}$ cm$^{-3}$. On the (100) plane of the GaAs substrate 11, a long stripe-shaped resist mask 25 is formed in a direction <01$\bar{1}$>.

Figure 3B:
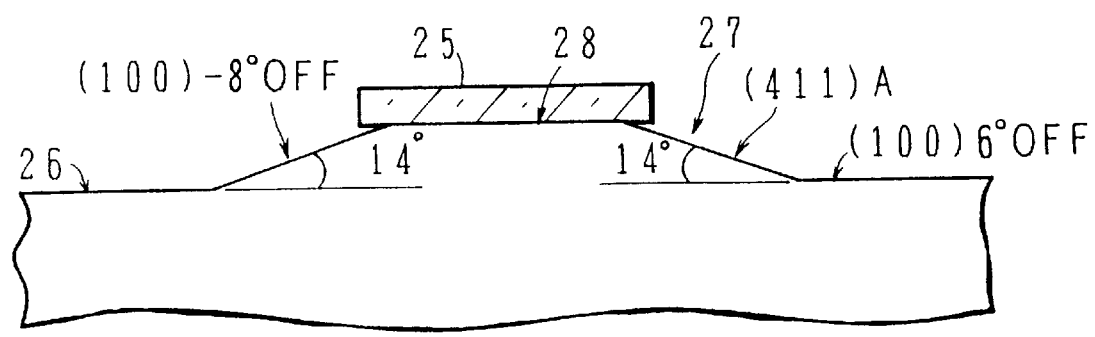

As can be seen from FIG. 3B,. using the resist mask 25 as an etching mask, wet etching is performed with HF based solution such that a (411)A plane appears on one side of the mask 25.

That is, the (100) plane is kept remained in the region covered with the resist mask 25, the (411)A plane is formed on the first side thereof, and the (100) plane appears again in a region outside the (411)A plane. As a result, a mesa structure having a height of about 1 $\mu$m is fabricated.

On the substrate 11 having the (411)A plane as a slope of the mesa structure, the layers of FIGS. 1 and 2 are successively grown by metal organic vapor phase epitaxy (MOVPE).

First, for growing the first buffer layer 12, there are supplied at growth temperature 670° C. about 0.5 sccm oftriethylgaleium (TEG) as a Ga source, about 25 sccm (V/III ratio≅50) of arsine AsH$_3$ as an As source, about $4.0 \times 10^{-3}$ sccm (VI/V ration≅$1.6 \times 10^{-4}$) of H$_2$Se as an n-type impurity for 30 minutes to grow a GaAs layer which is 0.5 $\mu$m thick in the flat plane portions.

Next, supplying about 0.3 sccm TEG, about 0.29 sccm trimethylindium (TMI), about 240 sccm (V/III≅400) phosphine (PH$_3$), and about $4.0 \times 10^{-3}$ sccm (VI/V $1.6 \times 10^{-5}$) H$_2$Se for about five minutes, there is formed an about 0.1 $\mu$m thick Ga$_{0.5}$In$_{0.5}$P film as the second buffer layer 13.

In this case, when one minute elapses after the growth is started, the growth temperature is gradually increased from 670° C. to 710° C. in about three minutes for the following reason. The growth will fail if the group V element is altered from arsenic (As) to phosphorus (P) after the temperature is increased, namely, it is favorable to increase the temperature after the element, As is changed to phosphorus.

For the cladding layer 14 above the second buffer layer 13, there are supplied about 0.2 sccm trimethylaluminum (TMA)$_2$, about 0.13 sccm TEG, about 0.49 sccm TMI, about 310 sccm (V/III ratio≅300) of PH$_3$, and about $6.2 \times 10^{-4}$ sccm (VI/V ration≅$2.0 \times 10^{-6}$) H$_2$Se for 36 minutes to resultantly grow an about 1.2 $\mu$m thick n-type $(Al_{0.7}Ga_{0.3})_{0.5}In_{0.5}P$ film. In this case, the portion of the layer 14 along the (411)A plane has a thickness of about 1.45 $\mu$m.

Next, for the guide layer 15, there are supplied about 0.09 sccm (TMA)$_2$, about 0.21 sccm TEG, about 0.37 sccm TMI, about 310 sccm (V/III ratio≅300) PH$_3$, and about $6.2 \times 10^{-4}$ sccm (VI/V ratio≅$2.0 \times 10^{-6}$) H$_2$Se for 7 min 30 sec so as to grow an n-type $(Al_{0.4}Ga_{0.6})_{0.5}In_{0.5}P$ layer having a thickness of about 0.2 $\mu$m. The portion of the layer 15 along the (411)A plane has a height of about 0.24 $\mu$m.

The non-doped GaInP active layer 16 having a thickness of about 150 angstrom is grown by supplying about 0.2 sccm TEG, about 0.33 sccm TMI, and about 240 sccm (V/III ratio≅400) PH$_3$ for about 45 seconds. The active layer 63 has a thickness of about 300 angstrom in the slant plane portion.

For the first upper cladding layer 17, there are supplied about 0.2 sccm (TMA)$_2$, about 0.13 sccm TEG, about 0.49 sccm TMI, about 310 sccm (V/III ratio≅300) PH$_3$, and about $5 \times 10^{-5}$ sccm (II/III ratio≅$5 \times 10^{-5}$) Cp2Mg for 27 minutes to grow a p-type $(Al_{0.7}Ga_{0.3})_{0.5}In_{0.5}P$ layer having a thickness of about 0.9 $\mu$m. The portion of the cladding layer 17 along the (411)A plane is about 1.1 $\mu$m thick.

For the second upper cladding layer and the current blocking layer 18, there are supplied about 0.2 sccm (TMA)$_2$, about 0.13 sccm TEG, about 0.49 sccm TMI, about 310 sccm (V/III ratio≅300) PH$_3$, about 0.1 sccm (II/III ratio≅0.1) dimethylzinc (DMZn), and about $6.2 \times 10^{-4}$ sccm (VI/V ratio $2.0 \times 10^{-6}$) H$_2$Se for about nine minutes to form an about 0.3 $\mu$m thick simultaneously doped layer on the (100) plane.

The layer 18 thus grown has a thickness of about 0.36 $\mu$m in a portion thereof along the (411)A plane. The flat plane portions of the layer 18 are of the n-type and have a carrier concentration of about $7 \times 10^{-17}$ cm$^{-3}$. In the slant plane portion, the layer is of p-type and has a carrier concentration of about $5 \times 10^{17}$ cm$^{-3}$.

For the first spike preventing layer 19, there are supplied about 0.09 sccm (TMA)$_2$, about 0.21 sccm TEG, about 0.37 sccm TMI, about 310 sccm (V/III≅300) PH$_3$, and about $5 \times 10^{-5}$ sccm (II/III ratio≅$6 \times 10^{-5}$) Cp2Mg for about 90 seconds to grow a p-type $(Al_{0.4}Ga_{0.6})_{0.5}In_{0.5}P$ layer having a thickness of about 400 angstrom.

For the second spike preventing layer 20, there is grown a p-type $Ga_{0.5}In_{0.5}P$ layer having a thickness of about 0.1 µm on the (100) plane by supplying about 0.3 sccm TEG, about 0.29 sccm TMI, about 240 sccm (V/III ratio≅400)$PH_3$, about 0.06 sccm (II/III ratio≅0.1) DMZn for five minutes.

In this case, when one minute elapses after the growth is initiated, the growth temperature is gradually deceased from 710° C. to 670° C. in about three minutes.

For the contact layer 21, an about 5 µm thick p-type GaAs layer is grown at a growth temperature of 670° C. through a three-hour process in which about 1 sccm TMG, about 50 sccm (V/III ratio≅50) $AsH_3$ and about 0.05 sccm (II/III ratio≅0.05) DMZn are supplied for two hours and then the same quantities of TMG and $AsH_3$ and 0.2 sccm (II/III ratio≅0.2) DMZn are supplied for one hour.

The obtained half-finished product is then subjected to various processes such as device isolation, contact formation, cleavage, and end-surface coating to completely produce the structure of a semiconductor laser device, which is then bonded to a heatsink with the n-side region thereof facing the heatsink.

Although the description has been given of an example of structure of a semiconductor laser device formed of semiconductor materials including AlGaInP based compounds, the similar structure can be also applied to a semiconductor laser device formed of other semiconductor compounds. The (411)A plane has been employed by way of example for the slant plane portion. However, there may be adopted any other plane having a growth rate and a doping characteristic different from those of the flat plane portions.

In the example, the semiconductor laser device emitting light from slant or slope plane is configured such that light is emitted in a stable state from the lower region of the slant plane portion thereof. However, it is also possible to construct the semiconductor laser device to emit light from the upper region of the slant plane portion in a stable state.

When the central point of the plane supplying carriers flowing into the active layer is shifted to the upper or lower side by at least 1/10 of the width W of the active layer relative to the central point of the active layer, the stable light emission can be continuously effected from the upper or lower side portion, respectively.

Although the current blocking layer includes only one layer in the description, there may be employed structures in which the current blocking layer is formed of a plurality of sub-layers. Other layers such as a spike preventing layer may be inserted when necessary.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

We claim:

1. A method of manufacturing a semiconductor laser, comprising the step of a vapor phase growth of growing on a patterned semiconductor substrate an active layer and an upper cladding layer including an AlGaInP layer, the substrate including a first flat plane portion; a second flat plane portion, and a stripe-shaped slant plane portion connecting the first flat plane portion and the second flat plane portion, wherein the upper cladding layer is grown under a condition substantially satisfying $$R = aTg^2 + bTg + cTg + d\alpha \text{ and satisfying } R > 1,$$

where $R = t1/t2$ is a slant plane ratio, $t2$ is a thickness of the flat plane portions of the upper cladding layer, $t1$ is a thickness of the slant plane portion thereof, $Tg$ is a growth temperature, $\alpha$ is a V/III ratio of growth materials, $a = 1.9999 \times 10^{-4}$, $b = -0.297985$, $c = 111.505$, and $d = 1.6667 \times 10^{-3}$.

2. A method of manufacturing a semiconductor laser according to claim 1, wherein the V/III ratio a is corrected as $$\alpha = 128 \times \alpha_{EXP} \times P_G / E_{RG} \times F_T,$$

where $\alpha_{EXP}$ is a V/III ratio of growth raw materials, PG is a growth pressure in torr, ERG Is a growth efficiency in µm/mol, and $F_T$ is a total flow rate in sml.

3. A method of manufacturing a semiconductor laser according to claim 1 wherein the semiconductor substrate is an n-type substrate, the method further including the steps of simultaneously doping the upper cladding layer with p-type and n-type dopants and thereby forming an auxiliary upper cladding layer having a p-type portion on the slant plane portion and n-type portions on the flat plane portions.

4. A method of manufacturing a semiconductor laser according to claim 2, wherein the semiconductor substrate is an n-type substrate, the method further including the steps of simultaneously doping in the upper cladding layer and with p-type and n-type dopants thereby forming an auxiliary upper cladding layer having a p-type portion on the slant plane portion and n-type portions on the flat plane portions.

* * * * *